(12) United States Patent
Lin

(10) Patent No.: US 7,808,790 B2
(45) Date of Patent: Oct. 5, 2010

(54) FASTENING APPARATUS

(75) Inventor: Ian Lin, Taipei (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/368,341

(22) Filed: Feb. 10, 2009

(65) Prior Publication Data

US 2009/0217496 A1 Sep. 3, 2009

(30) Foreign Application Priority Data

Feb. 29, 2008 (TW) .............................. 97107228 A

(51) Int. Cl.
*H05K 7/20* (2006.01)
(52) U.S. Cl. .................. 361/719; 361/704; 257/718; 257/719; 257/727; 24/453; 24/458; 165/80.3
(58) Field of Classification Search ........................ None
See application file for complete search history.

(56) References Cited

U.S. PATENT DOCUMENTS

| | | | |
|---|---|---|---|
| 6,307,747 B1 | 10/2001 | Farnsworth et al. | |
| 6,307,748 B1 * | 10/2001 | Lin et al. | 361/704 |
| 6,392,889 B1 * | 5/2002 | Lee et al. | 361/704 |
| 6,418,024 B2 | 7/2002 | Edevold et al. | |
| 6,563,716 B1 | 5/2003 | Truong et al. | |
| 6,795,317 B1 * | 9/2004 | Liu | 361/704 |
| 6,858,792 B2 | 2/2005 | Franz et al. | |
| 7,126,823 B2 * | 10/2006 | Chen et al. | 361/702 |
| 7,180,743 B2 * | 2/2007 | Chen et al. | 361/704 |
| 7,405,939 B2 * | 7/2008 | Yang | 361/719 |
| 7,480,144 B2 * | 1/2009 | Li | 361/704 |

* cited by examiner

*Primary Examiner*—Boris L Chervinsky
(74) *Attorney, Agent, or Firm*—Yuanmin Cai

(57) ABSTRACT

A fastening apparatus for fastening a first device to a second device is disclosed. The apparatus comprises a standoff member disposed through a through hole of the first device; a clamp member having a clamp portion for clamping the standoff member; a sleeve member having a hollow body and enclosing the clamp member, wherein the clamp member is compressed in the hollow body; a resilient member wrapping around the sleeve member; a rotatable cam member pivotly coupled to the clamp member; and a cap member arranged between the rotatable cam member and the resilient member, wherein the rotatable cam member is rotated to a first location to compress the resilient member for causing a first preload force exerted on the second device.

24 Claims, 7 Drawing Sheets

FASTENING APPARATUS

CROSS REFERENCE TO RELATED APPLICATION

The present application claims the benefit of priority of a Taiwan Patent Application Serial Number: 97107228, filed Feb. 29, 2008 with the Taiwan Patent Office, the content of which is incorporated herein by reference in its entirety.

FIELD OF THE INVENTION

The invention relates to a fastening apparatus, and more particularly to an apparatus for fastening a first device to a second device.

BACKGROUND OF THE INVENTION

A computer component, such as a CPU, generally generates a large amount of heat, resulting in an unstable operation of the computer and thus the damage thereof. For maintaining the normal operation of the CPU, the generated heat must be timely removed. A thermal dispassion mechanism, such as a heat think, is a popular way to dissipate the generated heat.

A close and stable contact force between the thermal dispassion mechanism and the computer component is required to achieve the purpose of effective thermal dissipation. FIG. 1 schematically shows an approach of a fastening apparatus 108 for a thermal dispassion mechanism 104, wherein a motherboard 112, an enclosure 192, a CPU 116 located in a slot 124 of the motherboard 112 are also depicted. Each fastening apparatus 108 has a helical spring 180, a screw 164, and a corresponding standoff 168. The standoff member 168 is mounted on the base member of the enclosure 192. The helical spring 180 wraps around the neck portion of the screw 164 and contacts with an upper surface of the thermal dispassion mechanism 104. The helical spring 180 and the screw 164 cooperate to maintain a good contact force between the thermal dispassion mechanism 104 and the CPU 116.

In this approach, the user uses a tool (for example, a screw driver) to drive the screws to fasten the thermal dispassion mechanism 104. The helical spring 180 is helpful to provide the proper contact force between the thermal dispassion mechanism 104 and the CPU 116. By choosing various helical springs 180, the user can use the standoffs 168, the screws 164 and the helical springs 180 to achieve a specific contact force between the thermal dispassion mechanism 105 and the CPU 116. However, since this approach need a manual operation of tools, the process thereof is inconvenient and the cost thereof is high, and thus this approach is not easy to use.

Another approach is to simply use standoffs and screws. The user assembles the components according to his experience. The effect of this approach is even worse. Firstly, it's hard to precisely achieve the desired specific contact force. Secondly, it's hard to maintain a constant contact force for a long period of time. For example, under different temperatures, the screws tend to expand when heated and contract when cooled, so the contact force therebetween varies in accordance with different temperatures. On the other hand, the screws may erode after a period of time, resulting in the situation that the contact force is not enough.

SUMMARY OF THE INVENTION

The present invention may provide a fastening apparatus technology for fastening a first device to a second device, which provides an effect of reliable and uniform fastening.

The present invention may provide a fastening apparatus technology for a thermal dissipation mechanism, wherein the contact force therebetween is constant under various environments.

The present invention may provide a fastening apparatus technology for assembling components toolessly.

A first general aspect of the present invention provides a fastening apparatus. The fastening device is adapted to fastening a first device to a second device. The fastening device may comprise: a standoff member disposed through a through hole of the first device; a clamp member having a clamp portion for clamping the standoff member; a sleeve member having a hollow body and enclosing the clamp member, wherein the clamp member is compressed in the hollow body; a resilient member wrapping around the sleeve member; and a rotatable cam member coupled to the clamp member, wherein the rotatable cam member is rotated to a first location to compress the resilient member for causing a first preload force exerted on the second device.

The clamp portion may comprise a first clamp and a second clamp. The first and second clamp may be in a first status of compressed in the sleeve member and a second status of protruding out of the sleeve member.

The sleeve member may confine the clamp member to firmly clamp the standoff member in response to the standoff member being clamped by the clamp member and the clamp member being in the first status of compressed in the sleeve member.

The sleeve member may be moved along a first direction by an external force to compress the resilient member, such that the clamp member is in the second status of protruding out of the sleeve member to receive a head portion of the standoff member. The clamp member may clamp the head portion and may be compressed in the sleeve member in response to the external force being removed.

The rotatable cam member may comprise a rotatable cam, an arm for being rotated to the first location to provide the first preload force on the resilient member, and a retention portion for securing the arm to the first location in response to the arm being rotated to the first location to obtain the first preload force.

The apparatus may further comprise a cap member arranged between the cam member and the resilient member, for engaging with the retention portion and retaining the arm to the first location, wherein the sleeve member further comprises a circular protrusion, and the resilient member is arranged between the cam member and the circular protrusion.

The arm may be rotated to a second location to provide a second preload force on the resilient member, wherein the second preload force is smaller than the first preload force.

A user may use his thumb to exert a first force on theca member, and use at least one of the other fingers to exert a second force on the sleeve member to allow the clamp member to protrude out of the sleeve member, and wherein the direction of the second force is opposite to that of the first force.

A second general aspect of the present invention provides a thermal dissipation device. The thermal dissipation device may comprise: a thermal dissipation mechanism, comprising a base member; and the above fastening apparatus.

A third general aspect of the present invention provides an information handling system. The system may comprise: a motherboard; an integrated circuit coupled to the motherboard; a thermal dissipation mechanism having a base member, disposed to be in thermal contact with the integrated circuit; and the above fastening apparatus.

The foregoing and other features of the invention will be apparent from the following more particular description of the embodiments of the invention.

BRIEF DESCRIPTION OF THE DRAWINGS

The embodiments of this invention will be described in detail, with reference to the following figures, wherein.

DETAILED DESCRIPTION OF THE INVENTION

Figure 1:
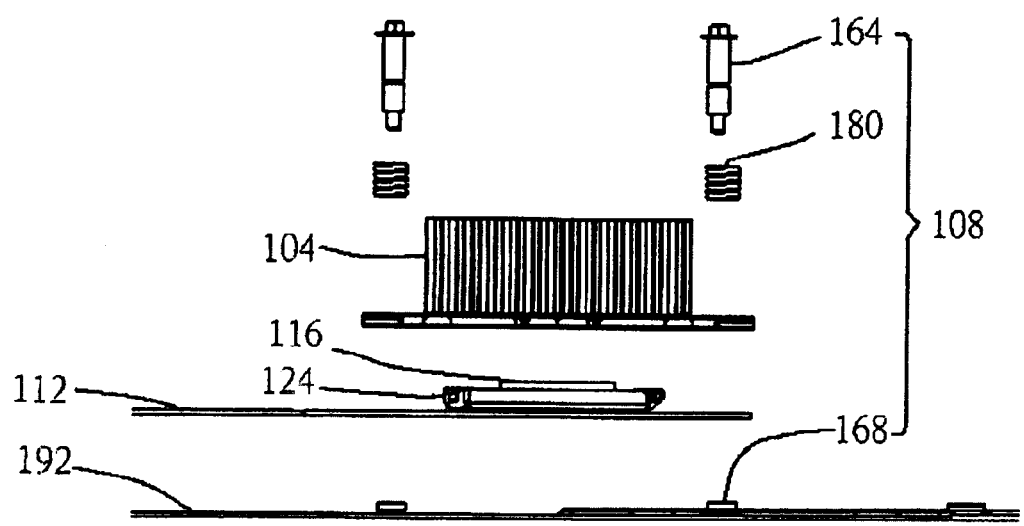
FIG. 1 schematically shows an approach to fastening a heat sink to a motherboard.
Figure 2:
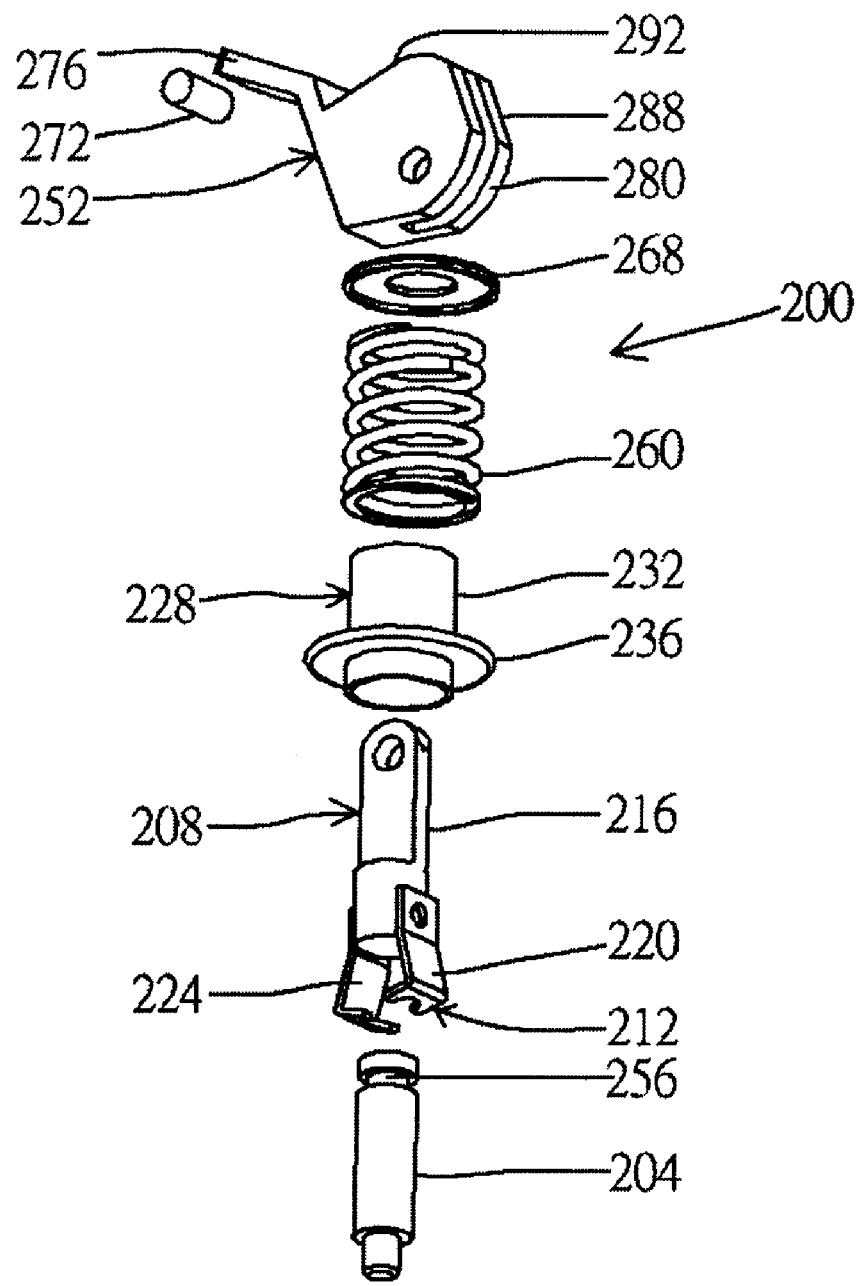
FIG. 2 shows an explosive view of a fastening apparatus according to one preferred embodiment of the present invention.

FIG. 2 shows an explosive view of a fastening apparatus according to one preferred embodiment of the present invention. Taking a fastening apparatus 200 for a thermal dissipation mechanism for example, it comprises a standoff member 204 and a clamp member 208. A circular trench 256 is formed on the standoff member 204. The clamp member 208 comprises a connection portion 216 and a clamp portion 212 for clamping the standoff member 204. The clamp portion 212 comprises a first clamp 220 and a second clamp 224.

The fastening apparatus 200 further comprises a sleeve member 228, a resilient member 260, a cap member 268, and a rotatable cam member 252. The sleeve member 228 has a hollow body 232 enclosing the clamp member 208, and a circular protrusion 236 formed around the hollow body 232.

The rotatable cam member 252 is pivotly coupled to the connection portion 216 of the clamp member 208 by use of a connection member 272. The connection member 272 can be a rotating axle. The rotatable cam member 252 can be rotated around the connection member 272. The rotatable cam member 252 can comprise a rotatable cam 280, and an arm 276. After all the components are assembled, the user can exert a force to the arm 276 of the rotatable cam member 252 and rotate it such that the arm 276 is rotated from an original location to a specific location. The above rotation operation can compress the resilient member 260 to provide a specific preload force on the thermal dissipation mechanism to be fastened. The specific preload force is proportional to the compression of the resilient member 260. The details of the rotatable cam member 252 will be described in the following paragraphs. The resilient member 260 can be a helical spring, which wraps around the hollow body 232 of the sleeve member 228 and is compressed between the cap member 268 and the circular protrusion 236.

The rotatable cam member 252 can further comprise at least one engaging plane. The details of the engaging plane will be described in the following paragraphs. The user can rotate the arm 276 of the rotatable cam member 252. In response to the arm 276 rotated to the specific location, the rotatable cam 280 compresses the resilient member 260, so that a preload force is provided to the thermal dissipation mechanism. In this preferred embodiment, the engaging member can be an engaging plane, and the cap member 268 can be a cap. The cap member 268 is arranged between the rotatable cam member 252 and the resilient member 260 and has a through hole mounted thereon such that the clamp member 208 is mounted therethrough. In response to the arm 276 being rotated to the specific location and the specific preload force being achieved, the cap member 268 engages with the engaging plane such that the rotatable cam member 252 is no more rotated and the specific preload force is constantly provided.

Under different considerations, the rotatable cam member 252 can be optionally designed. For example, the fastening apparatus 200 can be designed to simultaneously provide a full-load preload force and a semi-load preload device, or can be designed to only provide a full-load preload force. In the preferred embodiment shown in FIG. 2, a full-load preload force and a semi-load preload force can be simultaneously provided. There are two engaging planes: a first engaging plane 292 and a second engaging plane 288. For example, when the user rotates the arm 276 to the pre-defined end location (we name it a first location), the rotatable cam member 252 provides a full-load preload force through the resilient member 260. After the specific full-load preload force is provided, the first engaging plane 292 is designed to engage with the cap member 268, such that the arm 276 of the rotatable cam member 252 is firmly located on the first location and the full-load preload force is constantly provided. However, when the user rotates the arm 276 to a halfway location (we name it a second location), the rotatable cam member 252 provides a semi-load preload force through the resilient member 260. After the specific semi-load preload force is provided, the second engaging plane 288 is designed to engage with the cap member 268, such that the arm 276 of the rotatable cam member 252 is firmly located on the second location and the semi-load preload force is constantly provided. Then, the user can continue to rotate the arm 276 to the first location, such that the arm 276 is firmly located on the first location and the full-load preload force is constantly provided. Certainly, the rotatable cam member 252 can be designed to only provide a full-load preload force. That is, only an engaging plane 292 is designed, so that the rotatable cam member 252 can only provides a full-load preload force through the resilient member 260.

Figure 3:
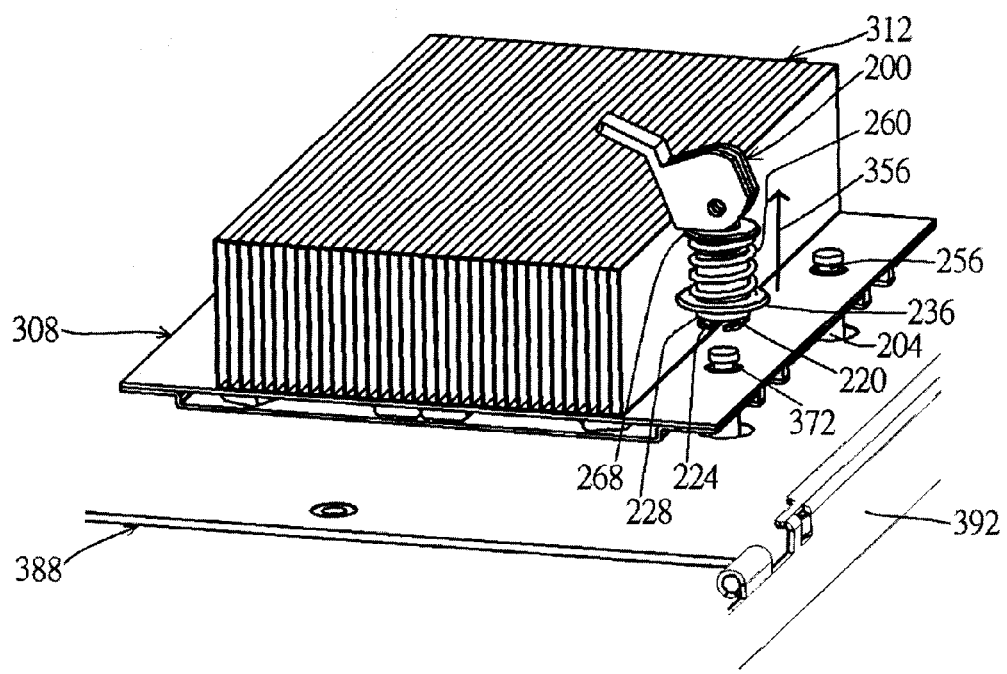
FIG. 3 schematically shows a fastening apparatus and a heat dispassion mechanism according to one preferred embodiment of the present invention.

FIG. 3 schematically shows an assembly of a fastening apparatus 200 and a heat dispassion mechanism 308 according to one preferred embodiment of the present invention. FIG. 3 also illustrates a motherboard 388 and a chassis 392. A plurality of through holes is formed on the peripheral area of the heat dispassion mechanism 308. In this embodiment, four through holes 372 are formed on the base of the heat dispassion mechanism 308. Each through hole 372 has a specific diameter for allowing the neck of the standoff member 204 to move vertically therein and not allowing the neck of the standoff member 204 to move horizontally therein. The standoff member 204 can be fixed to the chassis 392 in various ways. For example, the standoff member 204 can be threaded for threading into the chassis 392, or screws can be threaded into the standoff member 204 for fixing the standoff member 204 on the chassis 392. The standoff member 204 is thus firmly fixed and will not be loosened because of the external force. FIG. 3 also shows a situation after all the components of the fastening apparatus 200 are assembled.

Please refer to FIGS. 2 and 3, after all components of the fastening apparatus 200 are assembled, because of the resilient member 260 between the cap member 268 and the circular protrusion 236, the first clamp 220 and the second clamp 224 are compressed in the hollow body 232 of the sleeve member 228.

At this moment, the user can use one finger (for example, his thumb) of one hand (either the right hand or the left hand) to exert a first force on one part (for example, the arm 276) of the rotatable cam member 252. The user can simultaneously use other fingers (for example, the index finger and the middle finger) to exert a second force on the circular protrusion 236. The direction of the second force is substantially opposite to the direction of the first force. In other words, the user operate the fastening apparatus 200 in a way similar to operate the syringe, such that the sleeve member 228 is moved forward along a direction as indicated the arrow 356 (i.e., along the direction of the second force exerted by the index finger and the middle finger) and thus the resilient member 260 is compressed. Since the sleeve member 228 is moved along the direction of the second force exerted by the index finger and the middle finger, the first clamp 220 and the second clamp 224 are no more compressed in the hollow body 232 of the sleeve member 228. In fact, the first clamp 220 and the second clamp 224 protrude out of the hollow body 232 of the sleeve member 228 and in the released and uncompressed condition. The released first clamp 220 and second clamp 224 can thus receive the head portion of the standoff member 204.

The user keeps on holding the fastening apparatus 200 in order to allow the released first clamp 220 and second clamp 224 to receive the head portion of the standoff member 204. The circular trench 256 of the standoff member 204 is designed to be clamped by the first clamp 220 and the second clamp 224 when the first clamp 220 and the second clamp 224 are compressed. However, after the head portion of the standoff member is clamped by the first clamp 220 and the second clamp 224, the user can release the fastening apparatus 200 by no more exerting the force thereon. Because of the resilient member 260, the first clamp 220 and the second clamp 224 will be re-compressed in the hollow body 232 of the sleeve member 228. When the first clamp 220 and the second clamp 224 are compressed in the sleeve member 228 and clamp the standoff member 204, the sleeve member 228 limits the movement of the first clamp 220 and the second clamp 224 therein. The first clamp 220 and the second clamp 224 are thus forced to be compressed in the sleeve member 228 and firmly clamp the standoff member 204. As explained previously, the design of the circular protrusion 236 can allow the user to easily exert a force thereon by using his fingers in a direction as indicated by an arrow 356. On the other way, after the user releases his fingers, the resilient member 260 will be compressed between the cap member 268 and the circular protrusion 236, and the compression of the resilient member 260 is proportional to the preload force.

Figure 4A:
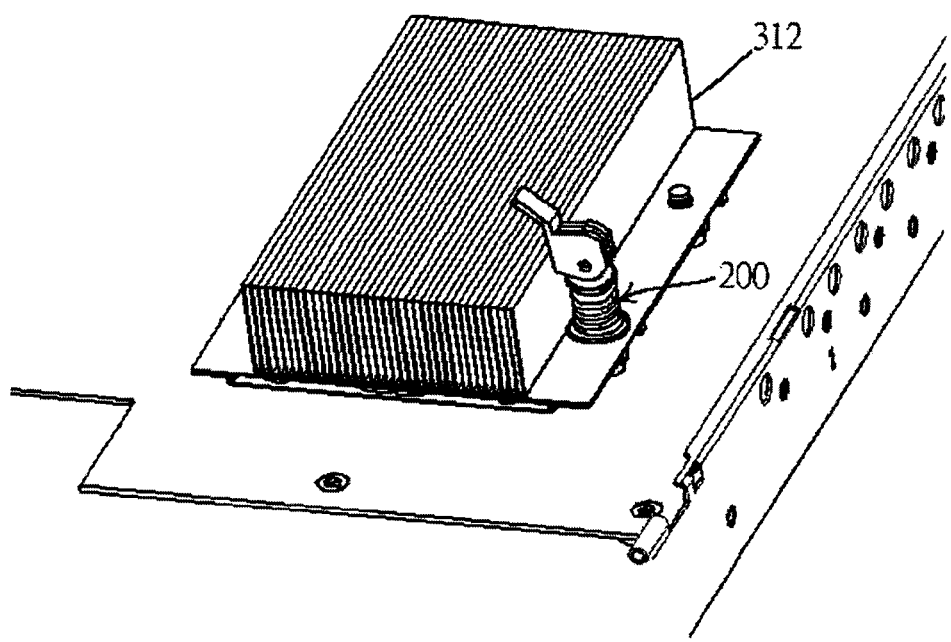
FIGS. 4A to 4C schematically shows the operation of a fastening apparatus according to one preferred embodiment of the present invention.
Figure 4B:
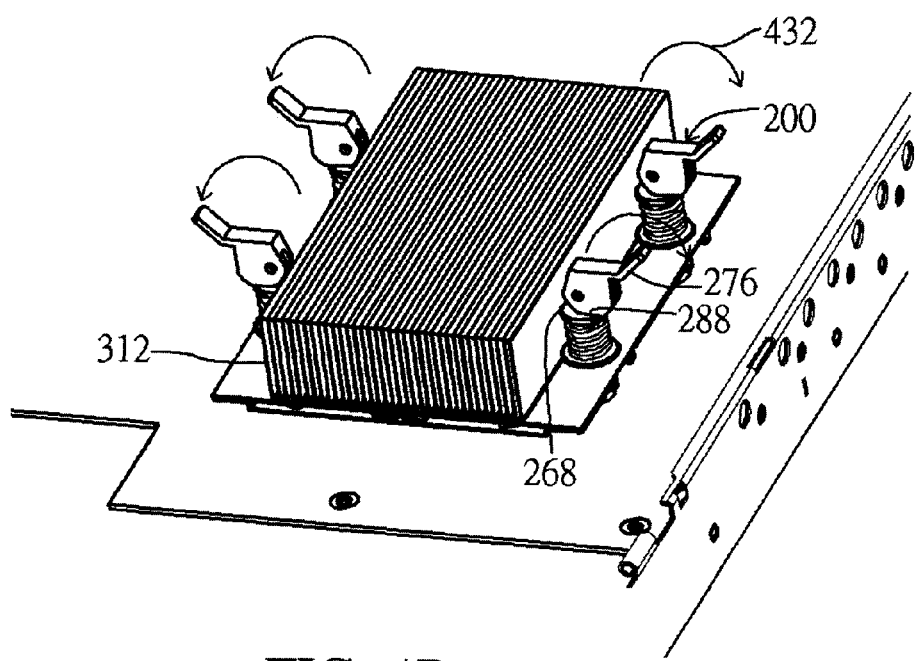
Figure 4C:
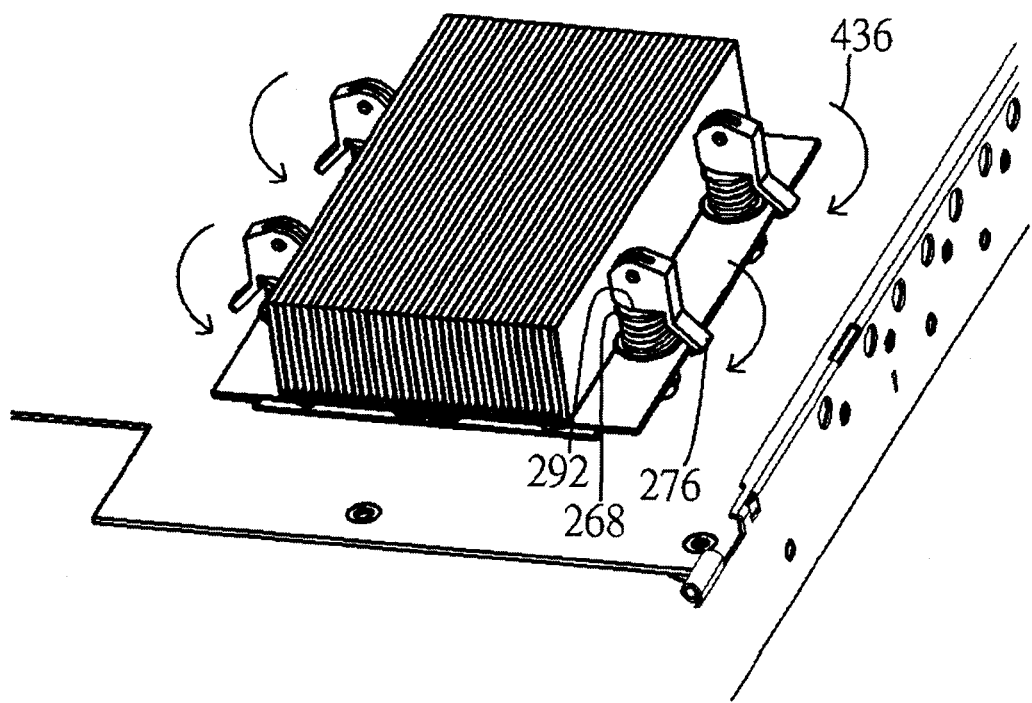

FIGS. 4A to 4C schematically show the operation of a fastening apparatus 200 according to one preferred embodiment of the present invention. Please refer to FIGS. 2, 3, and 4A to 4C, the details of the operation of the fastening apparatus 200 is well explained. After the user uses his thumb, index finger, and middle finger to operate the fastening device 200 as explained in previous paragraphs related to FIG. 3, the first clamp 220 and the second clamp 224 protrude from the sleeve member 228 and are ready to receive the standoff member 204. After the first clamp 220 and the second clamp 224 receive the standoff member 204, the user can release the fastening apparatus 200 and does not exert the force thereon, and the clamp member 208 can directly clamp the standoff member 204 and stand on the thermal dissipation mechanism 312. The fastening apparatus 200 stands still on the base member of the thermal dissipation mechanism 312 even the user does not use his hand/fingers to support the fastening apparatus 200.

Similar to the explanation in FIG. 4A, the remaining fastening apparatuses 200 are mounted on the other three corners of the base member of the thermal dissipation mechanism 312 in a similar way as shown in FIG. 4B.

Figure 5:
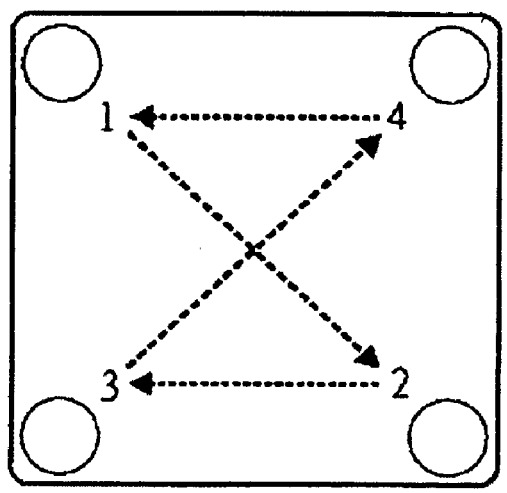
FIG. 5 schematically shows the fastening sequence according to one preferred embodiment of the present invention.

Referring again to FIG. 4B, after all fastening apparatuses 200 are all well mounted, the user can then fasten the fastening apparatuses 200 as described previously. In the preferred embodiment of providing a semi-load preload force and a full-load preload force, the user rotates the arm 276 to the second location in a direction as indicated by the arrow 432, and the rotatable cam member 252 provides a semi-load preload force through the resilient member 260. After the specific semi-load preload force is provided, the second engaging plane 288 is properly engaged with the cap member 268, such that the arm 276 of the rotatable cam member 252 is firmly located on the second location and the semi-load preload force is constantly provided. After the specific semi-load preload force is provided, the second engaging plane 288 is properly engaged with the cap member 268, such that the arm 276 of the rotatable cam member 252 is firmly located on the first location and the semi-load preload force is constantly provided. Please note: when the first clamp 220 and the second clamp 224 firmly clamp the standoff member 204 and the fastening apparatus 200 is thus standing on the base member of the thermal dissipation mechanism 312, the user cannot separate the fastening apparatus 200 from the standoff member 204 except for the situation that the user exert a force on the sleeve member 228 to lift the sleeve member 228 upwardly to allow the first clamp 220 and the second clamp 224 in an released condition. In other words, when the first clamp 220 and the second clamp 224 firmly clamp the standoff member 204 and the fastening apparatus 200 is thus standing on the thermal dissipation mechanism 312, the user can lift the sleeve member 228 upwardly to free the first clamp 220 and the second clamp from clamping the standoff member 204 without supporting the fastening apparatus 200 with another hand/fingers. Since the first clamp 220 and the second clamp 224 firmly clamp the standoff member 204, the fastening apparatus 200 thus will not fall over in other directions. In a similar way, the engaging planes 288 of the other three fastening apparatuses 200 are respectively engaged with the cap members 268. Thus, the four fastening apparatuses 200 simultaneously provide semi-load uniform preload forces on the thermal dissipation mechanism 312. The preferred fastening sequence of the four fastening apparatuses is in a diagonal way as shown in FIG. 5. The semi-load preload forces are applied to the fastening apparatuses 200, and the fastening sequence is indicated by the arrows (1->2->3->4).

As shown in FIG. 4C, after all fastening apparatuses 200 are fastened with semi-load preload forces, the user can then continue to rotate the arm 276 to the first location in a direction as indicated by the arrow 436, and the rotatable cam member 252 provides a full-load preload force through the resilient member 260. After the specific full-load preload force is provided, the first engaging plane 292 is properly engaged with the cap member 268, such that the arm 276 of the rotatable cam member 252 is firmly located on the first location and the full-load preload force is constantly provided. After the specific full-load preload force is provided, the first engaging plane 292 is properly engaged with the cap member 268, such that the arm 276 of the rotatable cam member 252 is firmly located on the first location and the full-load preload force is constantly provided. In a similar way, the engaging planes 292 of the other three fastening apparatuses 200 are respectively engaged with the cap members 268. Thus, the four fastening apparatuses 200 simultaneously provide full-load uniform preload forces on the thermal dissipation mechanism 312. In this preferred embodiment, the full-load preload force of each fastening apparatus 200 is about seven pounds. The preferred fastening sequence of the four fastening apparatuses is in a diagonal way as shown in FIG. 5. The full-load preload forces are applied to the fastening apparatuses, and the fastening sequence is indicated by the arrows (1->2->3->4).

On the other way, if the rotatable cam member 252 is designed to only have a first engaging plane 292, the step of applying the semi-load preload force as shown in FIG. 4B can be omitted.

According to the present invention, the fastening apparatus can firmly fasten various kinds of mechanisms without using tools. The user can exert a force on the sleeve member to lift the sleeve member upwardly, such that the first clamp and the second clamp can be in a released condition and be able to firmly clamp the standoff member. After the clamp member clamps the standoff member, the fastening apparatus can stand on the mechanism to be fastened. Then, the user can use only one finger to rotate the arm, and a constant preload force is provided and the fastening apparatus is firmly fastened. After the fastening apparatus stands on the mechanism, the user can easily rotate the arm without supporting the fastening apparatus 200 using another hand since the clamp member has firmly clamped the standoff member. Thus, the present invention provides a toolless and convenient way of fastening a first device (for example, a thermal dissipation mechanism) to a second device (for example, a motherboard of a computer system).

Further, the present invention discloses a fastening apparatus for providing a constant preload force only in need of rotating the arm. Under various environments (for example, environments of different temperature cycling, environments of different humidity cycling, or environments resulting in serious erosion), the present invention provides a uniform and reliable fastening effect.

The invention has been described in conjunction with the preferred embodiment. It is evident that numerous alternatives, modifications, variations and uses will be apparent to those skilled in the art in light of the foregoing description. It will be understood by those skilled in the art that the present invention may be practiced in support of the cooling of various microelectronic or micromechanical devices including, but not limited to, integrated circuits of the type commonly found in digital computer systems. It will also be understood that the present invention may be practiced in support of cooling by any apparatus meant to be held either in physical contact with or in a fixed location adjacent to the device to be cooled including, but not limited to, thermal dissipation mechanisms, heat sinks, fans, thermoelectric cooler modules, liquid-based heat pipes, airflow ducting, and/or various combinations of these. Specifically, although the invention has been depicted with thermal dissipation mechanisms that are generally rectangular in shape with the fan attached to the periphery of the thermal dissipation mechanisms, it will be understood by those skilled in the art that the thermal dissipation mechanism of various shapes and/or configurations may be used. Finally, although the invention has been depicted with fastening apparatuses used in computer systems, it will be understood by those skilled in the art that the present invention may be practiced in, but not limited to, the desktop computer systems, notebook computer systems, server systems, workstations, communication systems, and/or set-top boxes.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A fastening apparatus, adapted to fastening a first device to a second device, comprising:
   a standoff member disposed through a through hole of said first device;
   a clamp member having a clamp portion for clamping said standoff member;
   a sleeve member having a hollow body and enclosing said clamp member, wherein said clamp member is compressed in said hollow body;
   a resilient member wrapping around said sleeve member; and
   a rotatable cam member coupled to said clamp member, wherein said rotatable cam member is rotated to a first location to compress said resilient member for causing a first preload force exerted on said second device.

2. The apparatus of claim 1, wherein said clamp portion comprises a first clamp and a second clamp, said first and second clamp being in a first status of compressed in said sleeve member and a second status of protruding out of said sleeve member.

3. The apparatus of claim 2, wherein said sleeve member confines said clamp member to firmly clamp said standoff member in response to said standoff member being clamped by said clamp member and said clamp member being in said first status of compressed in said sleeve member.

4. The apparatus of claim 2, wherein said sleeve member is moved along a first direction by an external force to compress said resilient member, such that said clamp member is in said second status of protruding out of said sleeve member to receive a head portion of said standoff member, and said clamp member clamps said head portion and is compressed in said sleeve member in response to said external force being removed.

5. The apparatus of claim 1, wherein said rotatable cam member comprises a rotatable cam, an arm for being rotated to said first location to provide said first preload force on said resilient member, and a retention portion for securing said arm to said first location in response to arm being rotated to said first location to obtain said first preload force.

6. The apparatus of claim 1, further comprising a cap member arranged between said cam member and said resilient member, for engaging with said retention portion and retaining said arm to said first location, wherein said sleeve member further comprises a circular protrusion, and said resilient member is arranged between said cap member and said circular protrusion.

7. The apparatus of claim 1, wherein said arm is rotated to a second location to provide a second preload force on said resilient member, wherein said second preload force is smaller than said first preload force.

8. The apparatus of claim 1, wherein a user uses his thumb to exert a first force on said cam member, and uses at least one of the other fingers to exert a second force on said sleeve member to allow said clamp member to protrude out of said sleeve member, and wherein the direction of said second force is opposite to that of said first force.

9. A thermal dissipation device, comprising:
   a thermal dissipation mechanism, comprising a base member; and
   a fastening apparatus, comprising:

a standoff member disposed through a through hole of said base member;

a clamp member having a clamp portion for clamping said standoff member;

a sleeve member having a hollow body and enclosing said clamp member, wherein said clamp member is compressed in said hollow body;

a resilient member wrapping around said sleeve member; and a rotatable cam member coupled to said clamp member, wherein said rotatable cam member is rotated to a first location to compress said resilient member for causing a first preload force exerted on the thermal dissipation device.

10. The device of claim 9, wherein said claim portion comprises a first clamp and a second clamp, said first and second clamp being in a first status of compressed in said sleeve member and a second status of protruding out of said sleeve member.

11. The device of claim 10, wherein said sleeve member confines said clamp member to firmly clamp said standoff member in response to said standoff member being clamped by said clamp member and said clamp member being in said first status of compressed in said sleeve member.

12. The device of claim 10, wherein said sleeve member is moved along a first direction by an external force to compress said resilient member, such that said clamp member is in said second status of protruding out of said sleeve member to receive a head portion of said standoff member, and said clamp member clamps said head portion and is compressed in said sleeve member in response to said external force being removed.

13. The device of claim 9, wherein said rotatable cam member comprises a rotatable cam, an arm for being rotated to said first location to provide said first preload force on said resilient member, and a retention portion for securing said arm to said first location in response to arm being rotated to said first location to obtain said first preload force.

14. The device of claim 9, further comprising an cap member arranged between said cam member and said resilient member, for engaging with said retention portion and retaining said arm to said first location, wherein said sleeve member further comprises a circular protrusion, and said resilient member is arranged between said cap member and said circular protrusion.

15. The device of claim 9, wherein said arm is rotated to a second location to provide a second preload force on said resilient member, wherein said second preload force is smaller than said first preload force.

16. The device of claim 9, wherein a user uses his thumb to exert a first force on said cam member, and uses at least one of the other fingers to exert a second force on said sleeve member to allow said clamp member to protrude out of said sleeve member, and wherein the direction of said second force is opposite to that of said first force.

17. An information handling system, comprising:

a motherboard;

an integrated circuit coupled to said motherboard;

a thermal dissipation mechanism having a base member, disposed to be in thermal contact with said integrated circuit; and a fastening apparatus, comprising:

a standoff member disposed through a through hole of said base member;

a clamp member having a clamp portion for clamping said standoff member;

a sleeve member having a hollow body and enclosing said clamp member, wherein said clamp member is compressed in said hollow body;

a resilient member wrapping around said sleeve member; and a rotatable cam member coupled to said clamp member, wherein said rotatable cam member is rotated to a first location to compress said resilient member for causing a first preload force exerted on the thermal dissipation device.

18. The system of claim 17, wherein said claim portion comprises a first clamp and a second clamp, said first and second clamp arms being in a first status of compressed in said sleeve member and a second status of protruding out of said sleeve member.

19. The system of claim 18, wherein said sleeve member confines said clamp member to firmly clamp said standoff member in response to said standoff member being clamped by said clamp member and said clamp member being in said first status of compressed in said sleeve member.

20. The system of claim 18, wherein said sleeve member is moved along a first direction by an external force to compress said resilient member, such that said clamp member is in said second status of protruding out of said sleeve member to receive a head portion of said standoff member, and said clamp member clamps said head portion and is compressed in said sleeve member in response to said external force being removed.

21. The system of claim 17, wherein said rotatable cam member comprises a rotatable cam, an arm for being rotated to said first location to provide said first preload force on said resilient member, and a retention portion for securing said arm to said first location in response to arm being rotated to said first location to obtain said first preload force.

22. The system of claim 17, further comprising an cap member arranged between said cam member and said resilient member, for engaging with said retention portion and retaining said arm to said first location, wherein said sleeve member further comprises a circular protrusion, and said resilient member is arranged between said cap member and said circular protrusion.

23. The system of claim 17, wherein said arm is rotated to a second location to provide a second preload force on said resilient member, wherein said second preload force is smaller than said first preload force.

24. The system of claim 17, wherein a user uses his thumb to exert a first force on said cam member, and uses at least one of the other fingers to exert a second force on said sleeve member to allow said clamp member to protrude out of said sleeve member, and wherein the direction of said second force is opposite to that of said first force.

* * * * *